United States Patent
Kim et al.

(10) Patent No.: US 9,811,317 B2
(45) Date of Patent: Nov. 7, 2017

(54) METHOD AND APPARATUS FOR CONTROLLING RANGE OF REPRESENTABLE NUMBERS

(71) Applicant: SAMSUNG ELECTRONICS CO., LTD., Suwon-si (KR)

(72) Inventors: Changmoo Kim, Seoul (KR); Hyeongseok Yu, Seoul (KR); Soojung Ryu, Hwaseong-si (KR); Yeongon Cho, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 206 days.

(21) Appl. No.: 14/665,205

(22) Filed: Mar. 23, 2015

(65) Prior Publication Data
US 2016/0085507 A1   Mar. 24, 2016

(30) Foreign Application Priority Data
Sep. 18, 2014   (KR) .......... 10-2014-0124635

(51) Int. Cl.
*G06F 7/00* (2006.01)
*G06F 7/483* (2006.01)
*G06F 5/01* (2006.01)
*H03M 7/24* (2006.01)

(52) U.S. Cl.
CPC .............. *G06F 7/483* (2013.01); *G06F 5/012* (2013.01); *H03M 7/24* (2013.01); *G06F 2207/483* (2013.01)

(58) Field of Classification Search
CPC .......... G06F 7/483; G06F 5/012; H03M 7/24
USPC ........................................................ 708/209
See application file for complete search history.

(56) References Cited

U.S. PATENT DOCUMENTS

| 5,268,855 | A | 12/1993 | Mason et al. | |
|---|---|---|---|---|
| 5,652,584 | A * | 7/1997 | Yoon | G06F 7/556 341/50 |
| 6,253,299 | B1 | 6/2001 | Smith et al. | |
| 7,720,898 | B2 * | 5/2010 | Driker | G06F 7/49936 708/205 |
| 8,412,760 | B2 * | 4/2013 | Hickey | G06F 7/483 708/496 |
| 2011/0004644 | A1 | 1/2011 | Henry et al. | |

FOREIGN PATENT DOCUMENTS

KR   10-1020430 B1   3/2011

* cited by examiner

*Primary Examiner* — Tan V. Mai
(74) *Attorney, Agent, or Firm* — Harness, Dickey & Pierce, P.L.C.

(57) ABSTRACT

Provided are a method of controlling a range of representable numbers includes receiving a floating point value represented by an exponent and a mantissa, each represented by a predetermined numbers of bits, determining a bit configuration of the exponent and the mantissa of the floating point value based on a value of a most significant bit of the exponent of the floating point value, and determining a constant required for calculation of the floating point value according to the determined bit configuration of the exponent, and an apparatus for providing such a method.

20 Claims, 6 Drawing Sheets

METHOD AND APPARATUS FOR CONTROLLING RANGE OF REPRESENTABLE NUMBERS

CROSS-REFERENCE TO RELATED APPLICATIONS

This application claims the benefit of Korean Patent Application No. 10-2014-0124635 filed on Sep. 18, 2014, in the Korean Intellectual Property Office, the entire disclosure of which is incorporated herein by reference for all purposes.

BACKGROUND

1. Field

The following description relates to methods and apparatuses for controlling a range of representable numbers, where the numbers are represented by using a floating point method.

2. Description of Related Art

In the field of graphics processing, a floating point method of representing numbers is sometimes used for precise modeling and calculation. There are two main ways of representing decimal numbers in computer systems, which are a fixed point method and a floating point method. In a fixed point method, a decimal number is represented as being equal to an integer, and a fraction is allocated to specific lower bits. As an alternative, the floating point method is a method of representing a decimal number by using an exponent part and a mantissa part. Here, the exponent is a base raised to a certain power and the mantissa, also known as a significand, is a digit string representing a value multiplied by the exponent part.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Provided are methods and apparatuses for controlling a range of representable numbers represented by using a floating point method.

Additionally, provided are computer programs stored in a non-transitory storage medium which, when executed by a hardware processor, are used for implementing the methods.

In one general aspect, a method of controlling a range of representable numbers includes receiving a floating point value represented by an exponent and a mantissa, each represented by a predetermined number of bits, determining a bit configuration of the exponent and the mantissa of the floating point value based on a value of a most significant bit of the exponent of the floating point value, and determining a constant required for calculation of the floating point value based on the determined bit configuration of the exponent.

The method may further include shifting a position of the exponent or the mantissa of the floating point value by a predetermined number of bits based on the determined bit configuration, wherein the determining of the constant is performed by determining the constant required for calculation of the floating point value based on the exponent, the position of which is shifted.

The method may further include calculating the floating point value by using the exponent according to the determined bit configuration, the mantissa according to the determined bit configuration, and the determined constant.

The method may further include determining an exponent part and a mantissa part of the calculated value based on the determined bit configuration.

The method may further include rounding off the mantissa of the determined mantissa part.

The determining of the exponent part and the mantissa part may be performed by shifting the position of the exponent of the determined exponent part by a predetermined number of bits based on the determined bit configuration.

The method may further include outputting the floating point value including the exponent and the mantissa.

The receiving of the floating point value may be performed by receiving a floating point value, in which the most significant bit of the exponent of the floating point value is converted into a predetermined value.

The determining of the bit configuration may be performed by determining the bit configuration of the floating point value based on values of a predetermined number of bits of the exponent of the floating point value from the most significant bit of the exponent.

In another general aspect, an apparatus for controlling a range of representable numbers includes an input unit configured to receive a floating point value represented by an exponent and a mantissa, each represented by a predetermined number of bits, a bit configuration determination unit configured to determine a bit configuration of the floating point value based on a value of a most significant bit of the exponent of the floating point value, and a constant determination unit configured to determine a constant required for calculation of the floating point value based on the determined bit configuration of the exponent.

The apparatus may further include a position shifting unit configured to shift a position of the exponent or the mantissa of the floating point value by a predetermined number of bits based on the determined bit configuration, wherein the constant determination unit determines the constant required for calculation of the floating point value based on the exponent, the position of which is shifted.

The apparatus may further include a calculation unit configured to calculate the floating point value by using the exponent according to the determined bit configuration, the mantissa according to the determined bit configuration, and the determined constant.

The apparatus may further include an exponent/mantissa determining unit configured to determine an exponent part and a mantissa part of the calculated value based on the determined bit configuration.

The apparatus may further include a rounding unit configured to round off the mantissa of the determined mantissa part.

The exponent/mantissa determination unit may shift the position of the exponent of the determined exponent part by a predetermined number of bits based on the determined bit configuration.

The apparatus may further include an output unit configured to output the floating point value including the exponent and the mantissa.

The input unit may receive the floating point value, in which the most significant bit of the exponent of the floating point value is converted into a predetermined value.

The bit configuration determination unit may determine the bit configuration of the floating point value based on values of a predetermined number of bits of the exponent of the floating point value from the most significant bit of the exponent.

In another general aspect, a non-transitory computer-readable storage medium stores a program, the program including instructions for causing a processor to perform the method discussed above.

In another general aspect, a method of controlling a range of representable numbers includes determining a bit configuration of the exponent and the mantissa of a floating point value represented by an exponent and a mantissa, each represented by a predetermined number of bits, based on a value of a most significant bit of the exponent of the floating point value, determining a constant required for calculation of the floating point value based on the determined bit configuration of the exponent, and calculating the floating point value by using the exponent according to the determined bit configuration, the mantissa according to the determined bit configuration, and the determined constant.

Other features and aspects will be apparent from the following detailed description, the drawings, and the claims.

Figure 1:
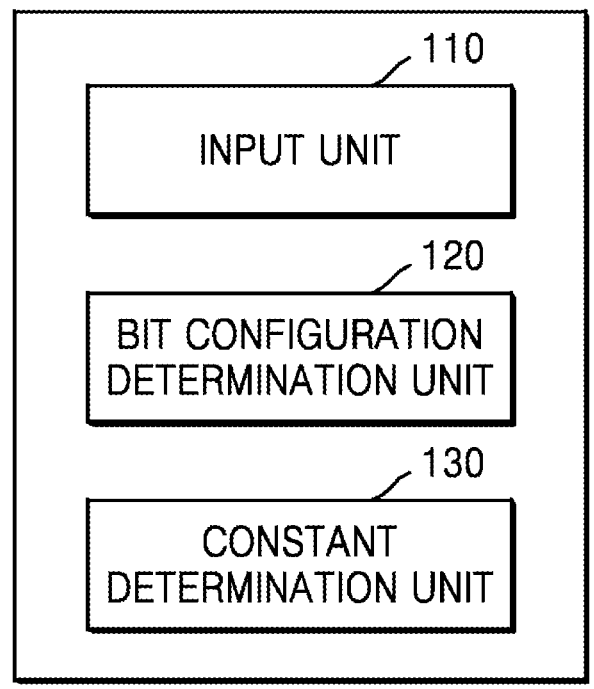
FIG. 1 is a block diagram of an apparatus for controlling a range of representable numbers according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Reference will now be made in detail to examples, some examples of which are illustrated in the accompanying drawings, wherein like reference numerals refer to like elements throughout. In this regard, the present examples potentially have different forms and are not intended to be construed as being limited to the descriptions set forth herein. Accordingly, the examples are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, the terms used in the specification are briefly described, and then the examples are described further.

The terms used in this specification are those general terms currently widely used in the art in consideration of aspects of the examples, but the terms may vary in meaning and use according to the intentions of those of ordinary skill in the art, precedents, or new technology in the art. Also, specified terms are potentially selected to have a specific meaning herein, and in this case, the detailed meaning thereof is described and clarified in the detailed description to specify the specific intended meaning. Thus, the terms used in the specification should be understood not as simple words but are intended to be based on the meaning of the terms in the context in the overall description of the examples.

Throughout the specification, the term "comprising" an element does not preclude other elements, and in such an example, the example optionally further includes one or more other elements unless otherwise stated. In addition, the term "unit" as used herein, refers to, but is not limited to, a hardware component such as a field-programmable gate array (FPGA) or application-specific integrated circuit (ASIC), where the unit performs certain tasks. In an example, such a unit is configured to reside on a non-transitory addressable storage medium and is configured to execute on one or more processors. In various examples, the functionality provided for in the components and units are combined into fewer components and units, in some examples, or further separated into additional components and units, in other examples.

Hereinafter, examples are described further by explaining examples with reference to the attached drawings. In the drawings, parts unrelated to the descriptions are omitted for clear description of the examples.

FIG. 1 is a block diagram of an apparatus 100 for controlling a range of representable numbers according to an example. In the example of FIG. 1, the apparatus 100 for controlling a range of representable numbers includes an input unit 110, a bit configuration determination unit 120, and a constant determination unit 130.

In various examples, a floating point value is represented in a half precision format, a single precision format, a double precision format, or the like. In a half precision format, 16 bits are used to represent a floating point value with an exponent part of 5 bits and a mantissa part of 10 bits. Thus, in such a half precision format, a range of representable numbers corresponding to the format is $\pm 2^{-14} \sim \pm 2^{16}$. The half precision format is generally used when low power is more important than high precision, because such a format uses less data to represent a given number. As a result, processing half precision format numbers requires processing less information, but has a limited amount of precision. Alternatively, in a single precision format, 32 bits are used to represent a floating point value with an exponent part of 8 bits and a mantissa part of 23 bits. Thus, in such a single precision format, a range of representable numbers corresponding to the format is $\pm 2^{-126} \sim \pm 2^{128}$. The single precision format is the most widely used format. The single precision format represents a compromise between managing the amount of data corresponding to a given number for fast processing while including enough information to provide sufficient precision.

In a double precision format, 64 bits are used to represent a floating point value with an exponent part of 11 bits and a mantissa part of 52 bits, and a range of representable numbers corresponding to the format is $\pm 2^{-1022} \sim \pm 2^{1024}$. The double precision format is used when a highly precise calculation is required, because it is capable of representing a wide range of numbers with a very precise mantissa. However, each double precision number requires considerably more bits to represent the number, and as a result computation using double precision numbers consumes significantly more processing resources.

In the example of FIG. 1, the input unit 110 receives a floating point value represented by an exponent and a mantissa, each of which is represented by a predetermined number of bits, respectively. In an example, in a floating point value represented by 16 bits, a sign is represented by 1 bit, an exponent is represented by 5 bits, and the mantissa is represented by 10 bits. This example corresponds to the half precision format discussed previously. In this example, the input unit 110 receives a floating point value represented by 5 bits of an exponent and 10 bits of a mantissa. For example, the input unit 110 receives a floating point value in which a most significant bit of the exponent is converted into a predetermined value. In such an example, the input unit 110 receives a floating point value in which the most significant bit of an exponent is converted into 0 or 1 as a bit for determining a bit configuration.

The bit configuration determination unit 120 determines the bit configuration of the floating point value in accordance with a value of the most significant bit of the exponent of the floating point value, as discussed with respect to the input unit 110. In some examples, the bit configuration determination unit 120 also determines the bit configuration of the floating point value in accordance with values of a predetermined number of bits of the exponent of the floating point value from the most significant bit of the exponent. For example, it is assumed that an input 16-bit floating point value is represented by a 1-bit sign, a 5-bit exponent, and a 10-bit mantissa, in accordance with the standard format of a half precision floating point value. In this example, when a value of the most significant bit of the exponent is 0, the bit configuration is determined to have 4 bits for the exponent and 10 bits for the mantissa. When the value of the most significant bit of the exponent is 1, the bit configuration is determined to have 5 bits for the exponent and 9 bits for the mantissa.

The constant determination unit 130 determines a constant required for calculation of the floating point value according to the exponent in accordance with the determined bit configuration, as above. The constant determination unit 130 determines a constant required for calculation of the floating point value in accordance with the exponent, the position of which is shifted. For example, when the exponent is determined to have 4 bits, the exponent represents from −6 to 7. However, in an example, the constant determination unit 120 determines the constant for calculation of the floating point value with respect to an original exponent as 7 in order to store the exponent by only using a positive number without using a negative number. For example, when the original exponent is −6, the exponent is stored as 1, which is obtained by adding the constant of 7 to the original exponent. That is, in this example, the constant determination unit 130 determines the constant in accordance with the value of most significant bit of the exponent.

Figure 2:
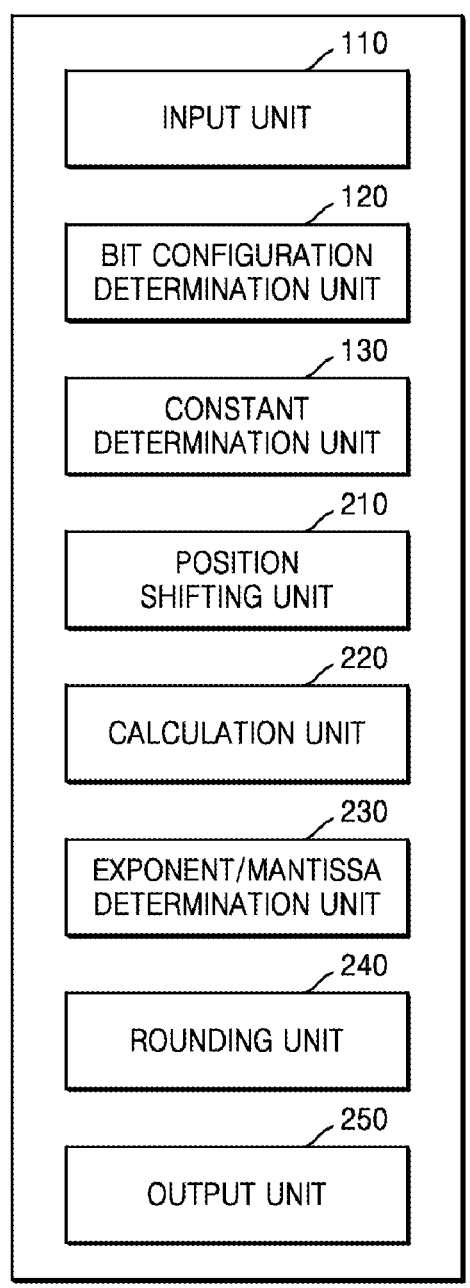
FIG. 2 is a block diagram of an apparatus for controlling a range of representable numbers according to another example.

FIG. 2 is a block diagram of an apparatus 200 for controlling a range of representable numbers according to another example. In the example of FIG. 2, the apparatus 200 for controlling a range of representable numbers includes an input unit 110, a bit configuration determination unit 120, a constant determination unit 130, a position shifting unit 210, a calculation unit 220, an exponent/mantissa determination unit 230, a rounding unit 240, and an output unit 250.

In the example of FIG. 2, the input unit 110 receives a floating point value represented by an exponent and a mantissa. The exponent and the mantissa are represented by predetermined number of bits, respectively. For example, in a floating point value represented by 16 bits, in this example, a sign is represented by 1 bit, an exponent is represented by 5 bits, and the mantissa is represented by 10 bits. Thus, in this example, the input unit 110 receives a floating point value represented by 5 bits of an exponent and 10 bits of a mantissa. The input unit 110 receives a floating point value in which a most significant bit of the exponent is converted into a predetermined value. For example, the input unit 110 receives a floating point value in which the most significant bit of an exponent is converted into 0 or 1 as a bit for determining a bit configuration. As discussed further below, such a most significant bit provides information about how to interpret the remainder of the floating point value.

In this example, the bit configuration determination unit 120 determines the bit configuration of the floating point value in accordance with a value of the most significant bit of the exponent of the floating point value. In some examples, the bit configuration determination unit 120 also determines the bit configuration of the floating point value in accordance with values of a predetermined number of bits of the exponent of the floating point value based upon the most significant bit of the exponent. For example, it is assumed that an input 16-bit floating point value is represented by a 1-bit sign, a 5-bit exponent, and a 10-bit mantissa. However, in a situation when a value of the most significant bit of the exponent is 0, the bit configuration is determined to have 4 bits for the exponent and 10 bits for the mantissa. Alternatively, when the value of the most significant bit of the exponent is 1, the bit configuration is determined to have 5 bits for the exponent and 9 bits for the mantissa. Thus, the value of the most significant bit provides the capability to control how much of the information included in the floating point value is allocated to providing a broader range of exponents and how much information is allocated to providing a precise mantissa.

In the example of FIG. 2, the constant determination unit 130 determines a constant required for calculation of the floating point value according to the exponent in accordance with the determined bit configuration. For example, the constant determination unit 130 determines a constant required for calculation of the floating point value in accordance with the exponent, the position of which is shifted based on the most significant bit as discussed above. For example, when the exponent is determined to have 4 bits, the exponent represents values from −6 to 7. However, in an example, the constant determination unit 120 determines the constant for calculation of the floating point value with respect to an original exponent as having a value of 7 in order to store the exponent by only using a positive number without using a negative number. For example, when the original exponent is −6, the exponent is stored as 1, which is obtained by adding the constant of 7 to the original exponent. That is, the constant determination unit 130 determines such a constant in accordance with the value of the most significant bit of the exponent.

Additionally, in the example of FIG. 2, the position shifting unit 210 shifts positions of bits of the exponent or the mantissa of the floating point value by a predetermined number of bits in accordance with the determined bit configuration. For example, when the exponent is determined to be represented by 4 bits, based on the most significant bit as discussed above, the position shifting unit 210 does not shift the position of the exponent. However, when the exponent is determined to be represented by 5 bits, also based on the most significant bit, the position shifting unit 210 shifts the position of the exponent left by 1 bit. In this manner, by performing such shifting, operations that use a floating point value in which an exponent is represented by 4 bits and a floating point value in which an exponent is represented by 5 bits are potentially performed in the same format. Also, when the mantissa is represented by 10 bits as a result of determining the exponent to be represented by 4 bits, the position shifting unit 210 does not shift the position of the exponent. However, when the mantissa is represented by 9 bits as a result of determining the exponent to be represented by 5 bits as discussed above, a 0 is added to the right of the rightmost bit of the mantissa and the position of the mantissa is shifted left by 1 bit position. By performing this additional step in addition to potentially shifting the mantissa, operations between a floating point value in which the mantissa is represented by 10 bits and a floating point value in which the mantissa is represented by 9 bits are potentially performed in the same format.

In the example of FIG. 2, the calculation unit 220 calculates a floating point value by using the exponent according to the determined bit configuration, the mantissa according to the determined bit configuration, and the determined constant, as discussed above. For example, operations, such as addition, subtraction, multiplication, and division, of floating point values are performed in accordance with the above techniques.

Also, the exponent/mantissa determination unit 230 determines an exponent part and a mantissa part of a calculated value by using the determined bit configuration, as discussed above. To do so, the exponent/mantissa determination unit 230 shifts the position of an exponent of the determined exponent part by a predetermined number of bits by using the determined bit configuration. For example, the exponent/mantissa determination unit 230 determines the exponent part corresponding to the exponent and the mantissa part corresponding to the mantissa in the calculated floating point value by using the bit configuration determined by the bit configuration determination unit 120.

The rounding unit 240 rounds off the mantissa of the determined mantissa part, as determined by the exponent/mantissa determination unit 230. Thus, when the mantissa of the determined mantissa part is represented by 10 bits, the rounding unit 240 rounds off the right of the rightmost bit of the mantissa. Alternatively, when the mantissa of the determined mantissa part is represented by 9 bits, the rounding unit 240 adds a 0 bit to the right of the rightmost bit of the mantissa, and then rounds off the right of the added bit.

Then, after the floating point value has been produced, the output unit 250 outputs the floating point value including the exponent and the mantissa.

Figure 3:
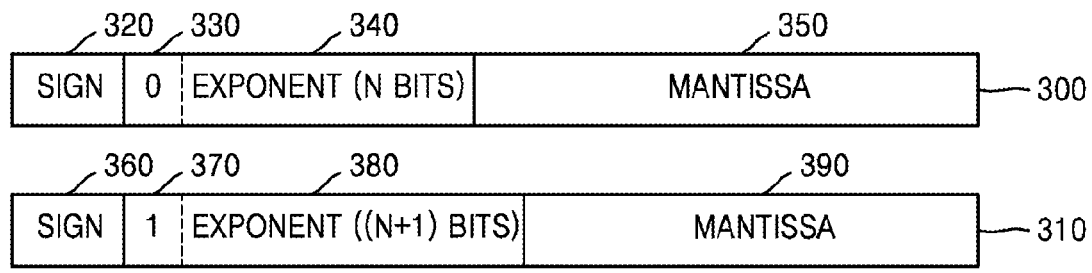
FIG. 3 is a diagram for illustrating a method of controlling a range of representable numbers according to an example.

FIG. 3 is a diagram for illustrating a method of controlling a range of representable numbers according to an example. FIG. 3 illustrates a method of determining a bit configuration of a floating point value as a first bit configuration 300 and a second bit configuration 310. In this example, when a sign bit 320 of the first bit configuration 300 is 0, the floating point value is considered to be a positive number, and when the sign bit 320 of the first bit configuration 300 is 1, the floating point value is considered to be a negative number. When a sign bit 360 of the second bit configuration 310 is 0, the floating point value is considered to be a positive number, and when the sign bit 360 of the second bit configuration 310 is 1, the floating point value is considered to be a negative number.

Since a most significant bit 330 of an exponent 340 is 0 in the first bit configuration 300, the bit configuration determination unit 120 determines that a bit configuration of the exponent 340 is to have N, where N is a natural number, bits from among the bits in the floating point value. Thus, when the total number of bits in the floating point value is assumed to be M, where M is another natural number of sufficient magnitude that the floating point value includes sufficient bits, a bit configuration of a mantissa 350 has M−N−1 bits, which are obtained by subtracting 1 bit of the sign and N bits of the exponent 340 from the total number of bits, M.

Alternatively, since a most significant bit 370 of an exponent 380 is 1 in the second bit configuration 310, the bit configuration determination unit 120 determines a bit configuration of the exponent 380 to have N+1 bits. Thus, when the total number of bits is assumed to be M, where M is a natural number, as discussed above, a bit configuration of a mantissa 390 has M−N−2 bits, which are obtained by subtracting 1 bit of the sign and N+1 bits of the exponent 380 from the total number of bits, M. In this case, in order to perform operations between the exponent 340 of the first bit configuration 300 and the exponent 380 of the second bit configuration 310 by aligning the bits of the exponent 340 and the bits of the exponent 380 in the same format, the position shifting unit 210 shifts a position of the exponent 380 of the second bit configuration 310 left by one bit. Also, the position shifting unit 210 converts the mantissa 390 of the second bit configuration 310 into the same format as the mantissa 350 of the first bit configuration 300 by adding a 0 bit to the right of the rightmost bit of the mantissa 390 of the second bit configuration 310 and shifts the position of the mantissa 390 left by one bit.

By using the bit configuration as illustrated in FIG. 3, the range of representable floating point numbers is increased by 1.5 times in comparison with the range when the bit configuration is fixed. This advantageous effect is achieved because a part for a number less than 1 is not changed, and a range of representable exponents for a number greater than 1 is doubled. Since the devices additionally installed to accomplish this effect are multiplexers, an increase in chip area and power consumption is limited because such devices are simple and do not unduly contribute to chip complexity.

Figure 4:
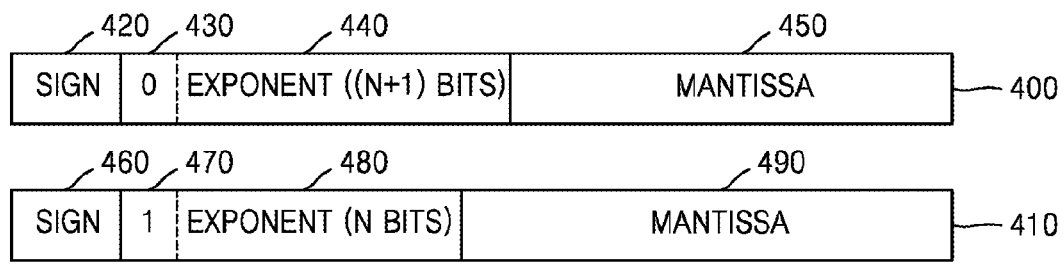
FIG. 4 is a diagram for illustrating a method of controlling a range of representable numbers according to another example.

FIG. 4 is a diagram for illustrating a method of controlling a range of representable numbers according to another example. FIG. 4 illustrates a method of determining a bit configuration of a floating point value based on using a first bit configuration 400 and a second bit configuration 410. When a sign bit 420 of the first bit configuration 400 is 0, the floating point value is interpreted to be a positive number, and when the sign bit 420 of the first bit configuration 400 is 1, the floating point value is interpreted to be a negative number. When a sign bit 460 of the second bit configuration 410 is 0, the floating point value is interpreted to be a positive number, and when the sign bit 460 of the second bit configuration 410 is 1, the floating point value is interpreted to be a negative number.

Since a most significant bit 430 of an exponent 440 is 0 in the first bit configuration 400, the bit configuration determination unit 120 determines a bit configuration of the exponent 440 to have N+1, where N is a natural number, bits. Thus, when the total number of bits is assumed to be M, where M is a natural number, a bit configuration of a mantissa 450 has M−N−2 bits, which are obtained by subtracting 1 bit of the sign and N+1 bits of the exponent 440 from the total number of bits. Since a most significant bit 470 of an exponent 480 is 1 in the second bit configuration 410, the bit configuration determination unit 120 determines a bit configuration of the exponent 480 to have N bits. Thus, when the total number of bits is assumed to be M, where M is a natural number, a bit configuration of a mantissa 490 has M−N−1 bits, which are obtained by subtracting 1 bit of the sign and N bits of the exponent 480 from the total number of bits.

In this case, in order to perform operations between the exponent 440 of the first bit configuration 400 and the exponent 480 of the second bit configuration 410 by aligning the bits of the exponent 440 and the bits of the exponent 480 to assume the same format, the position shifting unit 210 shifts a position of the exponent 440 of the first bit configuration 400 left by one bit. Also, the position shifting unit 210 converts the mantissa 450 of the first bit configuration 400 into the same format as the mantissa 490 of the second bit configuration 410 by adding a 0 bit to the right of the rightmost bit of the mantissa 450 of the first bit configuration 400 and shifts the position of the mantissa 450 left by one bit. Like the approach illustrated in FIG. 3, by using the bit configuration as illustrated in FIG. 4, the range of representable floating point numbers is also increased by 1.5 times compared with the range when the bit configuration is fixed. This advantage is achieved because a part for a number greater than 1 is not changed, and a range of the representable exponent for a number less than 1 is doubled. As with the approach of FIG. 3, since the devices additionally installed are multiplexers, an increase in chip area and power consumption is limited because such devices are simple and do not unduly contribute to chip complexity.

Figure 5:
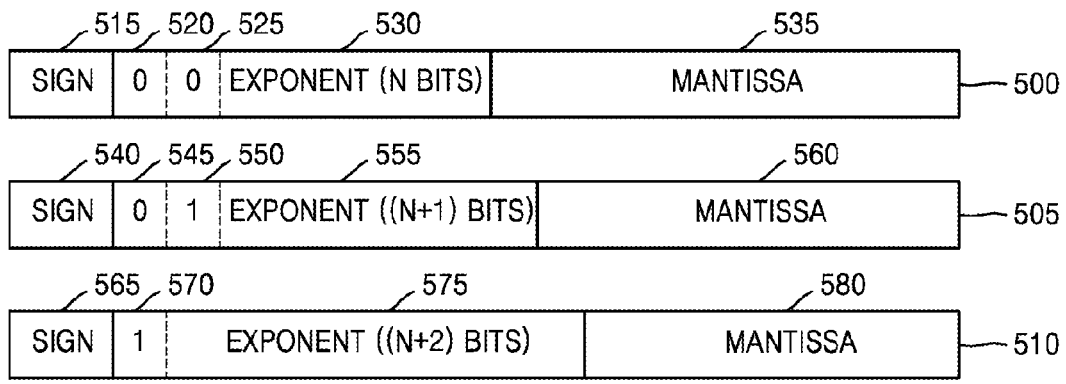
FIG. 5 is a diagram for illustrating a method of controlling a range of representable numbers according to another example.

FIG. 5 is a diagram for illustrating a method of controlling a range of representable numbers according to another example. FIG. 5 illustrates a method of determining a bit configuration of a floating point value using a first bit configuration 500, a second bit configuration 505, and a third bit configuration 510. When a sign bit 515 of the first bit configuration 500 is 0, the floating point value is interpreted to be a positive number, and when the sign bit 515 of the first bit configuration 500 is 1, the floating point value is interpreted to be a negative number. When a sign bit 540 of the second bit configuration 505 is 0, the floating point value is interpreted to be a positive number, and when the sign bit 540 of the second bit configuration 505 is 1, the floating point value is interpreted to be a negative number. When a sign bit 565 of the third bit configuration 510 is 0, the floating point value is interpreted to be a positive number, and when the sign bit 565 of the third bit configuration 510 is 1, the floating point value is interpreted to be a negative number.

Since a most significant bit 520 of an exponent 530 is 0, and a bit 525 next to the most significant bit 520 of the exponent 530 is 0 in the first bit configuration 500, the bit configuration determination unit 120 determines a bit configuration of the exponent 530 to have N, where N is a natural number, bits. Thus, when the total number of bits is assumed to be M, where M is a natural number, a bit configuration of a mantissa 535 has M−N−1 bits, which are obtained by subtracting 1 bit of the sign and N bits of the exponent 530 from the total number of bits.

Since a most significant bit 545 of an exponent 555 is 0, and a bit 550 next to the most significant bit 545 of the exponent 555 is 1 in the second bit configuration 505, the bit configuration determination unit 120 determines a bit configuration of the exponent 555 to have N+1 bits. Thus, when the total number of bits is assumed to be M, where M is a natural number, a bit configuration of a mantissa 560 has M−N−2 bits, which are obtained by subtracting 1 bit of the sign and N+1 bits of the exponent 555 from the total number of bits. In this situation, in order to perform operations between the exponent 530 of the first bit configuration 500 and the exponent 555 of the second bit configuration 505 by aligning the bits of the exponent 530 and the bits of the exponent 555 in the same format, the position shifting unit 210 shifts a position of the exponent 555 of the second bit configuration 505 left by one bit. Also, the position shifting unit 210 converts the mantissa 560 of the second bit configuration 505 into the same format as the mantissa 535 of the first bit configuration 500 by adding a 0 bit to the right of the rightmost bit of the mantissa 560 of the second bit configuration 505 and shifts the position of the mantissa 560 to the left by one bit.

Since a most significant bit 570 of an exponent 575 is 1 in the third bit configuration 510, the bit configuration determination unit 120 determines a bit configuration of the exponent 575 to have N+2 bits. Thus, when the total number of bits is assumed to be M, where M is a natural number, a bit configuration of a mantissa 580 has M−N−3 bits, which are obtained by subtracting 1 bit of the sign and N+2 bits of the exponent 575 from the total number of bits. In this situation, in order to perform operations between the exponent 530 of the first bit configuration 500 and the exponent 575 of the third bit configuration 510 by aligning the bits of the exponent 530 and the bits of the exponent 575 in the same format, the position shifting unit 210 shifts a position of the exponent 575 of the third bit configuration 510 left by two bits. Also, the position shifting unit 210 converts the mantissa 580 of the third bit configuration 510 into the same format as the mantissa 535 of the first bit configuration 500 by adding two 0 bits to the right of the rightmost bit of the mantissa 580 of the third bit configuration 510 and shifting the position of the mantissa 580 left by two bits. By using the bit configuration as illustrated in FIG. 5, the range of representable floating point numbers is increased by 2.75 times compared with the range when the bit configuration is fixed. This advantage is achieved because one quarter of the total range of representable numbers do not have their range changed, another quarter has their ranged doubled, and the other half have their range increased by four times, thereby increasing the total range of representable numbers by 2.75 times, based on the range increases which apply to certain subsets of representable numbers.

Figure 6:
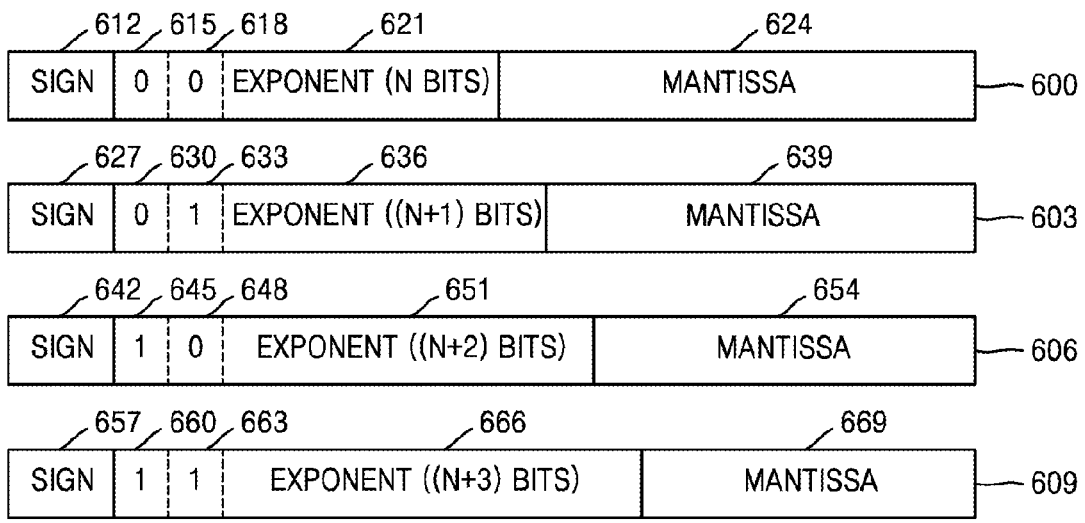
FIG. 6 is a diagram for illustrating a method of controlling a range of representable numbers according to another example.

FIG. 6 is a diagram for illustrating a method of controlling a range of representable numbers according to another example.

FIG. 6 illustrates a method of determining a bit configuration of a floating point value including a first bit configuration 600, a second bit configuration 603, a third bit configuration 606, and a fourth bit configuration 609. When a sign bit 612 of the first bit configuration 600 is 0, the floating point value is interpreted to be a positive number, and when the sign bit 612 of the first bit configuration 600 is 1, the floating point value is interpreted to be a negative number. When a sign bit 627 of the second bit configuration 603 is 0, the floating point value is interpreted to be a positive number, and when the sign bit 627 of the second bit configuration 603 is 1, the floating point value is interpreted to be a negative number. When a sign bit 642 of the third bit configuration 606 is 0, the floating point value is interpreted to be a positive number, and when the sign bit 642 of the third bit configuration 606 is 1, the floating point value is interpreted to be a negative number. When a sign bit 657 of the fourth bit configuration 609 is 0, the floating point value is interpreted to be a positive number, and when the sign bit 657 of the fourth bit configuration 609 is 1, the floating point value is interpreted to be a negative number.

Since a most significant bit 615 of an exponent 621 is 0, and a bit 618 next to the most significant bit 615 of the exponent 621 is 0 in the first bit configuration 600, the bit configuration determination unit 120 may determine a bit configuration of the exponent 621 to have N, where N is a natural number, bits. Thus, when the total number of bits is assumed to be M, where M is a natural number, a bit configuration of a mantissa 624 has M-N-1 bits, which are obtained by subtracting 1 bit of the sign and N bits of the exponent 621 from the total number of bits.

Since a most significant bit 630 of an exponent 636 is 0, and a bit 633 next to the most significant bit 630 of the exponent 636 is 1 in the second bit configuration 603, the bit configuration determination unit 120 determines a bit configuration of the exponent 636 to have N+1 bits. Thus, when the total number of bits is assumed to be M, where M is a natural number, a bit configuration of a mantissa 639 has M-N-2 bits, which are obtained by subtracting 1 bit of the sign and N+1 bits of the exponent 636 from the total number of bits. In this case, in order to perform operations between the exponent 621 of the first bit configuration 600 and the exponent 636 of the second bit configuration 603 by aligning the bits of the exponent 621 and the bits of the exponent 636 in the same format, the position shifting unit 210 shifts a position of the exponent 636 of the second bit configuration 603 left by one bit. Also, the position shifting unit 210 converts the mantissa 639 of the second bit configuration 603 into the same format as the mantissa 624 of the first bit configuration 600 by adding a 0 bit to the right of the rightmost bit of the mantissa 639 of the second bit configuration 603 and shifting the position of the mantissa 639 left by one bit.

Since a most significant bit 645 of an exponent 651 is 1, and a bit 648 next to the most significant bit 645 of the exponent 651 is 0 in the third bit configuration 606, the bit configuration determination unit 120 determines a bit configuration of the exponent 651 to have N+2 bits. Thus, when the total number of bits is assumed to be M, where M is a natural number, a bit configuration of a mantissa 654 has M-N-3 bits, which are obtained by subtracting 1 bit of the sign and N+2 bits of the exponent 651 from the total number of bits. In this case, in order to perform operations between the exponent 621 of the first bit configuration 600 and the exponent 651 of the third bit configuration 606 by aligning the bits of the exponent 621 and the bits of the exponent 651 in the same format, the position shifting unit 210 shifts a position of the exponent 651 of the third bit configuration 606 left by two bits. Also, the position shifting unit 210 converts the mantissa 654 of the third bit configuration 606 into the same format as the mantissa 624 of the first bit configuration 600 by adding two 0 bits to the right of the rightmost bit of the mantissa 654 of the third bit configuration 606 and shifting the position of the mantissa 654 left by two bits.

Since a most significant bit 660 of an exponent 666 is 1, and a bit 663 next to the most significant bit 660 of the exponent 666 is 1 in the fourth bit configuration 609, the bit configuration determination unit 120 determines a bit configuration of the exponent 666 to have N+3 bits. Thus, when the total number of bits is assumed to be M, where M is a natural number, a bit configuration of a mantissa 669 has M-N-4 bits, which are obtained by subtracting 1 bit of the sign and N+3 bits of the exponent 666 from the total number of bits. In this case, in order to perform operations between the exponent 621 of the first bit configuration 600 and the exponent 666 of the fourth bit configuration 609 by aligning the bits of the exponent 621 and the bits of the exponent 666 in the same format, the position shifting unit 210 shifts a position of the exponent 666 of the fourth bit configuration 609 left by three bits. Also, the position shifting unit 210 converts the mantissa 669 of the fourth bit configuration 609 into the same format as the mantissa 624 of the first bit configuration 600 by adding three 0 bits to the right of the rightmost bit of the mantissa 669 of the fourth bit configuration 609 and by shifting the position of the mantissa 669 left by three bits. By using the bit configuration as illustrated in FIG. 6, the range of representable floating point numbers is increased by 3.75 times compared with the range when the bit configuration is fixed. This advantage is achieved because a first quarter of the total range of representable numbers is not changed, a second quarter is doubled, a third quarter is increased by four times, and a fourth quarter is increased by eight times, thereby increasing the total range of representable numbers by 3.75 times, based on the range increases which apply to certain subsets of representable numbers.

Figure 7:
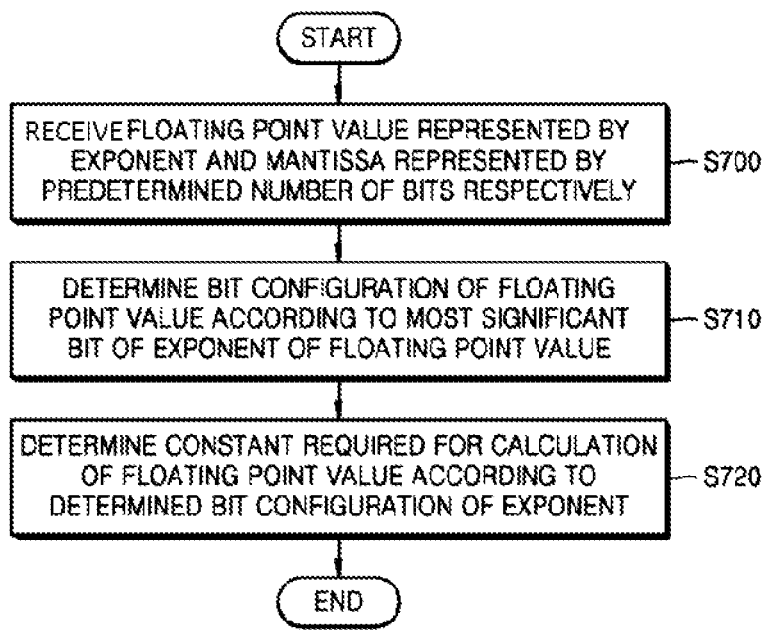
FIG. 7 is a flowchart of a method of controlling a range of representable numbers according to an example.

FIG. 7 is a flowchart of a method of controlling a range of representable numbers according to an example. Referring to FIG. 7, the method of controlling the range of representable number includes operating the apparatus 100 for controlling the range of representable numbers illustrated in FIG. 1 according to a series of operations occurring over time. Thus, descriptions given above with regard to the apparatus 100 illustrated in FIG. 1, although not repeated for brevity, also apply to the method illustrated in FIG. 7.

In operation S700, the method receives a floating point value represented by an exponent and a mantissa, which are represented by predetermined numbers of bits, respectively, is received. In operation S710, the method determines bit configurations of the exponent and the mantissa of the floating point value according to a value of the most significant bit of the exponent of the floating point value. In operation S720, the method determines a constant required for calculation of the floating point value according to the determined bit configuration of the exponent.

Figure 8:
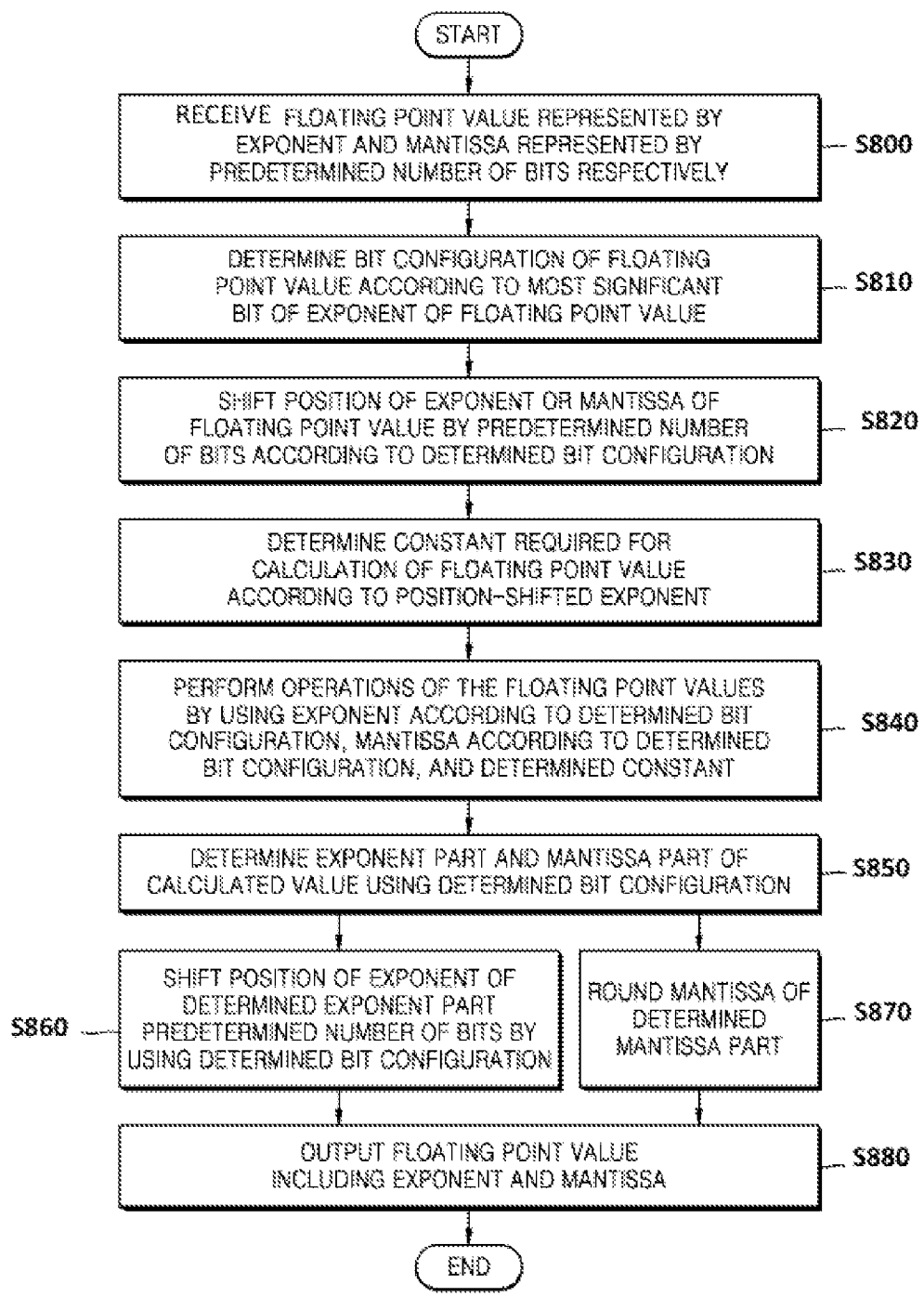
FIG. 8 is a flowchart of a method of controlling a range of representable numbers according to another example.

FIG. 8 is a flowchart of a method of controlling a range of representable numbers according to another example. Referring to FIG. 8, the method of controlling the range of representable numbers includes operating the apparatus 200 for controlling the range of representable numbers, illustrated in FIG. 2, according to a series of operations. Thus, descriptions given above with regard to the apparatus 200 illustrated in FIG. 2 although not repeated for brevity, also apply to the method illustrated in FIG. 8.

In operation S800, the method receives a floating point value represented by an exponent and a mantissa, which are represented by predetermined numbers of bits, respectively. In operation S810, the method determines bit configurations of the exponent and the mantissa of the floating point value according to a value of the most significant bit of the exponent of the floating point value. In operation S820, the method shifts a position of the exponent or mantissa of the floating point value by a predetermined number of bits according to the determined bit configuration. In operation S830, the method determines a constant required for calculation of the floating point value may be determined according to the exponent, the position of which is shifted. In operation S840, the method performs operations of the floating point values by using the exponent according to the determined bit configuration, the mantissa according to the determined bit configuration, and the determined constant. In operation S850, the method determines an exponent part and a mantissa part of a calculated value using the determined bit configuration. In operation S860, method shifts the position of the exponent of the determined exponent part by a predetermined number of bits by using the determined bit configuration. In operation S870, the method rounds off the mantissa of the determined mantissa part. In operation S880, the method outputs the floating point value including the exponent and the mantissa.

These examples are for illustrative purposes only and are not intended to limit the scope of the application. For the sake of brevity, conventional electronics, control systems, and other functional aspects of the systems are not described in detail. Furthermore, the connecting lines, or connectors shown in the various figures presented are intended to represent example functional relationships and/or physical or logical couplings between the various elements. It should be noted that many alternative or additional functional relationships, physical connections or logical connections may be present in other examples.

The use of the terms "a" and "an" and "the" and similar referents in the context of describing the examples, especially in the context of the following claims, are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are potentially performed in any suitable order unless otherwise indicated herein or otherwise clearly contradicted by context. However, the examples not limited by the order. The use of any and all examples, or exemplary language, for example, "such as," provided herein, is intended merely to better clarify the examples and does not pose a limitation on the scope of the examples unless otherwise claimed.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a nonexhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of controlling a range of representable numbers, the method comprising:
   receiving, by a processor, a floating point value represented by an exponent and a mantissa, each represented by a predetermined number of bits;
   determining, by the processor, a bit configuration of the exponent and the mantissa of the floating point value based on a value of a most significant bit of the exponent of the floating point value; and
   determining, by the processor, a constant required for calculation of the floating point value based on the determined bit configuration of the exponent.

2. The method of claim 1, further comprising:
   shifting, by the processor, a position of the exponent or the mantissa of the floating point value by a predetermined number of bits based on the determined bit configuration,
   wherein the determining of the constant includes determining, by the processor, the constant required for calculation of the floating point value based on the exponent, the position of which is shifted.

3. The method of claim 1, further comprising:
   calculating, by the processor, the floating point value by using the exponent according to the determined bit configuration, the mantissa according to the determined bit configuration, and the determined constant.

4. The method of claim 3, further comprising:
   determining, by the processor, an exponent part and a mantissa part of the calculated value based on the determined bit configuration.

5. The method of claim 4, further comprising:
   rounding off, by the processor, the mantissa of the determined mantissa part.

6. The method of claim 4, wherein the determining of the exponent part and the mantissa part includes shifting, by the processor, a position of the exponent of the determined exponent part by a predetermined number of bits based on the determined bit configuration.

7. The method of claim 4, further comprising:
   outputting, by the processor, the floating point value comprising the exponent and the mantissa.

8. The method of claim 1, wherein the receiving of the floating point value includes receiving, by the processor, a floating point value, in which the most significant bit of the exponent of the floating point value is converted into a predetermined value.

9. The method of claim 1, wherein the determining of the bit configuration includes determining, by the processor, the bit configuration of the floating point value based on values of a predetermined number of bits of the exponent of the floating point value from the most significant bit of the exponent.

10. A non-transitory computer-readable storage medium storing a program, the program comprising instructions for causing a processor to perform the method of claim 1.

11. An apparatus for controlling a range of representable numbers comprising:
    input circuitry configured to receive a floating point value represented by an exponent and a mantissa, each represented by a predetermined number of bits;
    bit configuration determination circuitry configured to determine a bit configuration of the floating point value based on a value of a most significant bit of the exponent of the floating point value; and
    constant determination circuitry configured to determine a constant required for calculation of the floating point value based on the determined bit configuration of the exponent.

12. The apparatus of claim 11, further comprising:
    position shifting circuitry configured to shift a position of the exponent or the mantissa of the floating point value by a predetermined number of bits based on the determined bit configuration,
    wherein the constant determination circuitry determines the constant required for calculation of the floating point value based on the exponent, the position of which is shifted.

13. The apparatus of claim 11, further comprising:
    calculation circuitry configured to calculate the floating point value by using the exponent according to the determined bit configuration, the mantissa according to the determined bit configuration, and the determined constant.

14. The apparatus of claim 13, further comprising:
    exponent/mantissa determining circuitry configured to determine an exponent part and a mantissa part of the calculated value based on the determined bit configuration.

15. The apparatus of claim 14, further comprising:
rounding circuitry configured to round off the mantissa of the determined mantissa part.

16. The apparatus of claim 14, wherein the exponent/mantissa determination circuitry is configured to shift a position of the exponent of the determined exponent part by a first number of bits based on the determined bit configuration.

17. The apparatus of claim 14, further comprising:
output circuitry configured to output the floating point value comprising the exponent and the mantissa.

18. The apparatus of claim 11, wherein the input circuitry is configured to receives the floating point value, in which the most significant bit of the exponent of the floating point value is converted into a predetermined value.

19. The apparatus of claim 11, wherein the bit configuration determination circuitry is configured to determines the bit configuration of the floating point value based on values of a predetermined number of bits of the exponent of the floating point value from the most significant bit of the exponent.

20. A method of controlling a range of representable numbers, the method comprising:
determining, by a processor, a bit configuration of an exponent and a mantissa of a floating point value represented by the exponent and the mantissa, each represented by a predetermined number of bits, based on a value of a most significant bit of the exponent of the floating point value;
determining, by the processor, a constant required for calculation of the floating point value based on the determined bit configuration of the exponent; and
calculating, by the processor, the floating point value by using the exponent according to the determined bit configuration, the mantissa according to the determined bit configuration, and the determined constant.

* * * * *